United States Patent [19]

Kitamura et al.

[11] 4,387,115
[45] Jun. 7, 1983

[54] COMPOSITION FOR CONDUCTIVE CURED PRODUCT

[75] Inventors: Tadashi Kitamura, Hiratsuka; Sumio Hirose, Yokohama, both of Japan

[73] Assignee: Mitsui Toatsu Chemicals, Inc., Tokyo, Japan

[21] Appl. No.: 289,887

[22] Filed: Aug. 4, 1981

[30] Foreign Application Priority Data

Aug. 8, 1980 [JP] Japan .............................. 55-109737
Mar. 25, 1981 [JP] Japan .............................. 56-042510

[51] Int. Cl.$^3$ ............................................ B05D 5/12
[52] U.S. Cl. ................................. 427/58; 252/512; 252/518; 427/96; 427/98; 428/901
[58] Field of Search ................ 264/104; 252/512, 518; 427/98, 96, 58; 428/901

[56] References Cited

U.S. PATENT DOCUMENTS

| | | |
|---|---|---|
| 2,687,395 | 8/1954 | Marks. |
| 3,014,818 | 12/1961 | Campbell. |
| 3,056,750 | 10/1962 | Pass. |
| 3,360,589 | 12/1967 | Raichle et al.. |
| 3,474,464 | 10/1969 | Matthews et al.. |
| 3,647,532 | 3/1972 | Friedman et al.. |
| 3,867,315 | 2/1975 | Tigner et al.. |
| 3,983,075 | 9/1976 | Marshall et al.. |
| 4,122,143 | 10/1978 | Momotari et al. .................. 264/104 |

*Primary Examiner*—Michael R. Lusignan
*Assistant Examiner*—Thurman K. Page
*Attorney, Agent, or Firm*—Fisher, Christen & Sabol

[57] ABSTRACT

Conductive cured products which have superior initial conductivity which is substantially retained even under high temperature and humidity conditions are obtained by curing a resinous composition comprising (a) a metallic copper powder, (b) a copper compound, (c) a compound having a 1,4-dihydroxy benzene ring or 1,2-dihydroxy benzene ring structure, and (d) a resinous curable component. Additionally, inclusion of a chelate forming compound in the uncured composition prevents a curing phenomenon on the surface of the composition during storage. The compound having the dihydroxy benzene ring (compound c) reduces the copper compound (b) to deposit metallic copper, and the resinous curable component integrates the constituents into a conductive product upon curing. The compositions are used as paints, adhesives, printing inks, and moulded articles, and they are useful in the electric, electronic, automobile, and housing fields.

23 Claims, No Drawings

COMPOSITION FOR CONDUCTIVE CURED PRODUCT

BACKGROUND OF THE INVENTION

1. Field of the Invention

The present invention relates to compositions for obtaining cured products which have superior initial conductivity which does not deteriorate substantially under high temperature and high humidity conditions. The present invention also relates to conductive cured resinous products and methods for making them.

2. Description of the Prior Art

The incorporation of metals, metallic salts, and metal complexes into resins to impart stability to the resin and/or conductivity to the resin is well-known in the art. U.S. Pat. No. 3,360,589 discloses hardenable, unsaturated polyester moulding masses which are stabilized by copper complex compounds. Soluble cupric compounds, it is disclosed, further improve or exceed the stabilizing effect of phenolic gelling inhibitors such as hydroquinone, tert-butyl-pyrocatechol, p-benzoquinone, and other gelling inhibitors such as aromatic amines, amine salts, and quaternary phosphonium and arsonium salts. The soluble cupric compounds, it is taught, have the disadvantage of causing a greenish-brown to greenish-blue discoloration of the originally colorless polyester moulding masses. The use of colorless cuprous compounds, such as cuprous halides was found to be unsatisfactory because large amounts of solubilizing agents were needed to obtain a homogeneous composition. Complex compounds of cuprous chloride and/or cuprous bromide with neutral phosphoric acid esters were found to improve storage stability and reduce discoloration of the polyeser moulding masses. Use of the composition to obtain conductive cured products is not taught in U.S. Pat. No. 3,360,589. U.S. Pat. No. 3,474,464 discloses a process for preparing metal acetylacetonates which can be used to enhance the stability of chlorine-containing polymers such as polyvinyl chloride. The production of conductive cured products is not disclosed.

U.S. Pat. No. 3,647,532 discloses a conductive ink composition which contains copper powder, a reducing agent such as hydrazine hydrate, glass frit and an organic binder such as an acrylic or ethyl cellulose. To produce a conductive circuit, firing is required to sinter the glass frit and to burn away the binder.

U.S. Pat. No. 2,687,395 discloses methyl methacrylate polymers of improved electrical conductivity which are produced by dissolving a metal halide such as aluminum, zinc, or stannic halide in methyl methacrylate and subjecting the mixture to polymerization conditions.

Resin bonded electrical resistors are disclosed in U.S. Pat. No. 3,056,750. The resistor material comprises a plurality of discrete units which are dispersed in a polymerized resin. Each discrete unit comprises an aggregate of conductive particles of either carbon or metal, or both. The particles are bonded together by a solid polymerized resinous material to form the discrete unit. The metal particles can be copper, iron, aluminum, zinc, etc. However, merely mixing a copper powder with a resin results in a product which has poor conductivity because the peripherial edges of the copper powder particles are oxidized by oxygen in the air to form a coating of copper oxide.

U.S. Pat. No. 3,867,315 discloses conductive resinous compositions which contain a copper metal-containing solid and a metallic salt such as zinc chloride. The conductive compositions are prepared by incorporating the metal particulate and metal salt into a polymer by conventional polymer blending techniques. Conductivity is achieved by heating the blended composition. The space between the copper metal particles is occupied by the metal salt to impart conductivity to the resin. Inclusion of a stabilizing agent is not disclosed.

U.S. Pat. No. 3,983,075 teaches a conductive, cured epoxy resin which is filled with copper flakes. Treatment of the copper flakes to remove surface deposits prior to admixture with the resin is taught as being essential. Immediate use of the copper flakes and immediate curing of the resin is needed to avoid degradation of the flakes. Also, it has been found that a cured product prepared, for example, by dissolving copper oxide with an acid to form a copper oxide-free copper powder and mixing the copper powder with a resin followed by curing, cannot retain its conductivity in air for more than about one month.

U.S. Pat. No. 3,014,818 discloses the production of electrically conductive polymeric articles by admixing a polymer with a reducible salt of copper, for example, and forming the admixture into a shaped article. The article is then treated to reduce the salt to the free metal. The free metal particles, it is disclosed, are dispersed throughout the polymeric material. The shaped articles are then plated by using a plating solution consisting essentially of an aqueous alkaline solution of a nickel or cobalt salt, a borohydride, and an agent which forms a complex with nickel or cobalt. The complexing agent keeps the nickel and cobalt in solution. Exemplary of the complexing agents are ammonia and organic complex-forming agents which contain amino groups, imino groups, carboxy groups or hydroxy groups. The shaped articles, it is disclosed, can also be plated with copper.

U.S. Pat. No. 4,122,143 discloses the production of conductive cured products by reacting a copper compound which is in the cuprous and/or cupric state with a reducing substance capable of reducing the copper compound to metallic copper. The reaction occurs in the presence of both a metallic copper powder and a resinous curable component on a substrate. The copper compound is reduced to metallic copper which precipitates on the metallic copper powder to link the particles of the metallic copper powder to form a conductive connected unit of the metallic copper powder. The resinous curable component is cure moulded during the reduction of the copper compound to integrate the connected unit and the resinous curable component into the conductive cured product.

When organic or inorganic phosphorous acid type compounds such as mono or diesters of phosphorous acid are used as a reducing agent in the process of U.S. Pat. No. 4,122,143, cured resins having a superior initial conductivity are obtained. The phosphorous-containing substances, it is disclosed, have an antirust effect on the metallic copper powder. However, applicants have found that when the cured resin of U.S. Pat. No. 4,122,143 is kept under high temperature and high humidity for a long period of time, a substance having the appearance of a green rust grew on the surface of the cured resin. Also, the conductivity of the cured resin decreased gradually under the high temperature and high humidity conditions.

Incorporation of known additives at the time of curing the resins is disclosed in U.S. Pat. No. 4,122,143. Among the additives disclosed are stabilizers such as hydroquinone, p-benzoquinone, phenothiazine, t-butyl catechol, and the like, chelating agents such as acetylacetone, ethylenediaminetetraacetic acid, triethanolamine, nitrilotriacetic acid, phytic acid, and the like, acidity modifiers such as amines, alkali metal hydroxides, carboxylic acids, acid salts, and the like. While the patent discloses the use of a compound having a dihydroxy benzene ring as a stabilizer, its use as a reducing agent to reduce the copper compound to metallic copper is not dislcosed. Additionally, the use of chelating agents to protect against the formation of a skin on the surface of the resinous composition for producing conductive cured products is not disclosed.

According to the present invention, there is provided a resinous composition for producing conductive cured resinous products which products have a superior initial conductivity. The cured products do not substantially generate a green rust-like substance under high temperature and high humidity storage conditions. Also, even under the latter conditions the conductivity of the cured products decreases only slightly and their resistance value does not change substantially. These unexpected results are obtained without the need for phosphorous-containing reducing substances which have a P-OH group as disclosed in U.S. Pat. No. 4,122,143.

The present invention also provides a resinous composition for producing conductive cured products which composition does not exhibit a skin forming phenomenon on its surface during storage for at least three months.

SUMMARY OF THE INVENTION

The present invention relates to a resinous composition for producing conductive cured resinous products which have superior initial conductivity and do not substantially generate a green rust-like substance under high temperature and high humidity storage conditions. The uncured compositions comprise: (a) a metal copper powder, (b) a copper compound, (c) a reducing agent which contains a substituted or unsubstituted ortho or para dihydroxy benzene ring (hereinafter referred to as a "dihydroxy benzene ring component"), (d) a resin component, and optionally (e) a chelate forming compound. If the composition does not contain the chelate forming compound (e) the storage stability of the composition of the present invention is greatly reduced because of a tendency for the surface of the composition to harden (hereinafter referred to as a "skin forming phenomenon") over a period of time. The composition of the present invention which does not contain the chelate forming compound must be used quickly after blending to avoid skin formation but the cured products obtained exhibit excellent initial conductivity which is substantially retained under high temperature and high humidity conditions. The present invention also relates to conductive resinous cured products which do not develop a rust-like green substance and which do not substantially lose their initial high conductivity over a long period of time. Methods for making the latter conductive cured resinous products are also encompassed by the present invention.

DETAILED DESCRIPTION OF THE INVENTION

The form of the metal copper powder used in the present invention need not be of any special structure. Examples are flake, arborescent (dendroidal), spherical, indeterminate, and the like. Furthermore, the metallic copper powder may be prepared by: (a) pulverization of copper metal (including the leaf form), (b) reducing cuprous oxide, cupric oxide and the like, (c) spraying and solidifying melted copper, (d) electrolytic deposition, and (e) mixing of two or three of the above obtained copper powders. Other known copper powders can also be used in the present invention.

The particle size of the copper powder is usually 100 microns or less. However, copper powders having a particle size of from about 100 microns to about 1 mm can also be used in the compositions of the present invention.

The metallic copper powder may be a powder composed of metallic copper alone (ie, a metallic copper powder having no copper compound on its surface either adhering thereto or as a coating), or it can be a commercial copper powder which usually has a surface film of one of the below-described copper compounds, such as cuprous oxide or cupric oxide. Of course, mixtures of any of the above copper powders in different forms or different particle sizes can be used in the compositions of the present invention.

The expressions "resin component" and "resinous curable component" as used in the present specification mean a compound which is a polymer before final curing or a compound that becomes a polymeric substance by a curing reaction and which becomes a conductive cured material at the time it is cured.

It is necessary that the composition of the present invention includes: (a) a metallic copper powder, (b) a copper compound, (c) a reducing agent which contains a 1,2 or a 1,4-dihydroxy benzene ring, and (d) a resin component for the attainment of conductive cured products which have a superior initial conductivity which does not substantially change under high temperature and high humidity conditions, and which products do not substantially generate a green rust-like substance under high temperature and high humidity storage conditions. Additionally, the composition of the present invention must include a chelate forming compound (e) to substantially protect against skin formation on the surface of the composition when the composition is not intended for use quickly (within about two days, for example) after blending. However, using four or five different components, respectively, corresponding to components (a), (b), (c), (d) and optionally (e) is not necessary. For example, a single compound which performs the function of at least two of the components (a), (b), (c), (d) and (e) can be used to obtain compositions having the above-described desired properties. Thus, the objects of the present invention can be achieved by mixing two or three or four kinds of compounds which fulfill the roles of components (a) through (e). For instance, to reduce the number of components in the compositions of the present invention a resin which has benzene rings with hydroxyl groups ortho or para to each other can be used in place of separate compounds which serve the role of components (c) and (d). Exemplary of the kinds of compounds which can be used in the present invention are:

(1) Compounds Which Serve The Role Of Component (b) Only: Copper halides such as cuprous chloride, cupric chloride, and the like; cuprous oxide, cupric oxide; inorganic acid salts of copper such as copper sulfate, cupric sulfate, and the like; organic acid salts of copper such as copper salicylate, copper stearate, and the like; and mixtures of the above copper compounds.

(2) Compounds Which Serve The Role Of Component (c) Only: Hydroquinone, catechol, 2-methylhydroquinone, vinyl hydroquinone, tertiary butyl hydroquinone, chlorohydroquinone, phenyl hydroquinone, and compounds having the chemical structure:

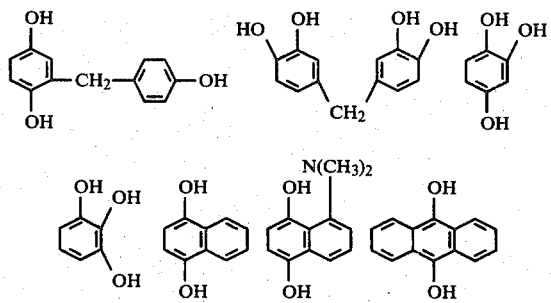

and mixtures thereof.

(3) Compounds Which Serve The Role Of Component (d) Only: Urea-formaldehyde resin, melamine-formaldehyde resin, phenol-formaldehyde resin, unsaturated polyester resin, thermosetting saturated polyester resin, polycarbonate resin, polyphenylene oxide resin, polyphenylene sulfide resin, aliphatic alkyd resin, polyamide resin, polyimide resin, epoxy acrylate resin, allyl resin (diallyl phthalate resin), epoxy resin, urethane resin, polyoxymethylene resin, spiroacetal resin, silicone resin, polysulfide rubber, acrylic resin, styrene resin, olefin resin, vinyl alcanoate resin, butadiene type rubber, isobutylene type rubber, ethylene-propylene type rubber, chloroprene rubber, epichlorohydrin rubber, cellulose type resin, rosin type resin, fluorocarbon type resin, phosphonitrile chloride type resin, ethyl silicate polymer and mixtures thereof.

(4) Compounds Which Serve The Roles Of Components (b) And (c): Copper compounds which have a dihydroxy benzene ring wherein the hydroxyl groups are ortho or para to each other, such as the copper salt of a dihydroxy benzene compound of paragraph (2) above, a copper salt of

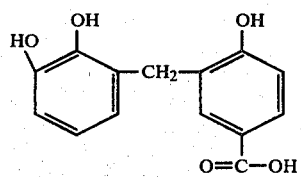

and mixtures thereof.

(5) Compounds Which Serve The Roles Of Components (b) and (d): Resinous copper compounds such as the copper salt of a saturated or unsaturated polyester resin, the copper salt of a vinyl chloride-vinyl acetate-maleic acid copolymer, the copper salt of a sulfoethyl methacrylate-ethylacrylate copolymer, the copper salt of a rosin type resin, and mixtures thereof.

(6) Compounds Which Serve The Roles Of Components (c) and (d): Resins which have dihydroxy benzene groups in the polymer or copolymer molecule wherein the hydroxyl groups are ortho or para to each other such as a polymer or copolymer of vinyl hydroquinone, a hydroquinone-formaldehyde phenolic type resin, a hydroquinone-phenol-formaldehyde phenolic type resin, a catechol-formaldehyde phenolic type resin, a 1,4-dihydroxy naphthalene-formaldehyde resin and mixtures thereof. The resins can be prepared by conventional processes for the preparation of phenol-formaldehyde resins.

(7) Compounds Which Serve The Roles Of Components (b), (c), And (d): Resins which have copper ions and dihydroxy benzene groups in the polymer or copolymer molecule wherein the hydroxyl groups are ortho or para to each other such as the copper salt of a copolymer of vinyl hydroquinone and methacrylic acid, the copper salt of the resins of paragraph 6 above, and mixtures thereof. These resins can be prepared in a conventional manner.

(8) Compounds Which Serve The Role Of Component (e): The chelate forming compounds used in the present invention preferably have a logarithm value of the stability constant Kma of cupric ion complex of more than or equal to 3, preferably more than or equal to 5, at an ionic strength of 0.1, at 25° C. Examples of these chelate forming compounds are:

8-1. Aliphatic amines and derivatives thereof: Ethylenediamine, N-(2-hydroxy-ethyl)ethylenediamine, trimethylenediamine, 1,2-diaminocyclohexane, triethylenetetramine 8-2. Nitrogen-containing heterocyclic amines: Purine, adenine, 2-aminomethylpyridine, histamine 8-3. β-diketones: Acetylacetone, trifluoroacetylacetone, 4,4,4-trifluoro-1-phenyl-1,3-butanedione, hexafluoroacetyl-acetone, benzoylacetone, dibenzoylmethane, 5,5-dimethyl-1,3-cyclohexanedione 8-4. Phenolic compounds: Oxine, 2-methyloxine, oxine-5-sulfonic acid, 1-nitroso-2-naphthol, 2-nitroso-1-naphthol, salicylaldehyde 8-5. Others: Dimethylglyoxime, 2,2'-dipyridil, and 1,10-phenanthroline Among the above-described chelate forming compounds, for the prevention of unpleasant odors and the prevention of the skin forming phenomenon, the chelate compounds illustrated in the above paragraphs 8-3, 8-4, and 8-5 are preferred, and acetylacetone, 4,4,4-trifluoro-1-phenyl-1,3-butanedione, benzoylacetone, dibenzoylmenthane, 5,5-dimethyl-1,3-cyclohexanedione, oxine, oxine-5-sulfonic acid, dimethylglyoxime, 1-nitroso-2-naphthol, salicylaldehyde, 2,2'-dipyridil, and 1,10-phenanthroline are particularly preferred.

Additionally, chelate forming compounds which serve the role of components (b), (c), or (d) can of course be used.

The amount of the copper compound used in the present invention is about 0.1 to 30% by weight, preferably about 0.2 to 10% by weight calculated as cuprous and/or cupric copper in the copper compound, based on the amount of metal copper powder.

The amount of the dihydroxy benzene ring component used in the present invention should be sufficient to reduce a substantial portion of the copper in the copper compound to metallic copper. The amount is preferably more than or equal to about 80% by weight, more preferably more than or equal to about 95% by weight based on the amount needed to reduce all of the copper in the copper compound to metallic copper. The upper amount is not limited. However, generally it is less than or equal to about 95% by weight of the non-volatile ingredients, exclusive of the metal copper powder, used in the compositions of the present invention.

The amount of the resin component should be sufficient to bind the components into an integral cured article. Generally, the amount of the resin component used in the present invention is about 5 to 60%, preferably about 8 to 45% by weight based on the total amount of non-volatile ingredients of the composition of the present invention.

Of the compounds which serve the role of the dihydroxy benzene ring component (c), the resinous dihydroxy benzene compounds (compounds of paragraph nos. 6 and 7 above) are particularly preferred. Cured conductive products obtained using compositions which contain the resinous dihydroxy benzene components have superior soldering properties. The latter cured products do not exhibit abnormalities such as blistering under severe conditions, such an immersion in a soldering bath at 300° C. for 10 seconds. However, when non-resinous dihydroxy compounds (such as those of paragraph nos. 2 and 4 above) are used in the compositions of the present invention, after curing the composition, the conductive cured product often exhibits some abnormality, such as blistering, under the severe conditions of immersion in a soldering bath at 300° C. for 10 seconds. However, no changes are observed in the latter cured conductive products after immersion in a soldering bath at 260° C. for about 10 seconds.

The amount of chelate forming compound (e) used in the present invention is suitably 0.5 to 100% by weight, preferably 1 to 50% by weight, more preferably 1 to 25% by weight based on the total weight of metallic copper powder (a) and copper compound (b) used in the present invention. If the amount of the chelate forming compound is too small, the prevention of skin formation is insufficient. If the amount of chelate forming compound is too large, the metal copper powder precipitates during storage because of the lowered viscosity of the composition. Additionally, coating or printing the composition on a base plate becomes difficult if the amount of the chelate forming compound (e) is too high. Even if coating or printing is possible, curing or drying of the composition requires too much time and also the conductivity of the cured product has a tendency to decrease with increasing amount of the chelate forming compounds.

The resin component (d) including the above-described compounds which serve the role of the resin component used in the present invention may be a solid per se. However, it must be substantially in the liquid state alone or in the presence of an organic solvent, water, a plasticizer, and the like, at the curing stage of the resin. The resin component (d) including the compounds which serve the role of the resin component can be used in any desired form, such as a solution in an organic solvent, an aqueous solution, an aqueous emulsion, an emulsion in an organic solvent, a 100% liquid resin, or a 100% solid resin which becomes liquid at the curing temperature.

The resin component, including compounds which serve the role of the resin component can be cured by methods known in the art according to the type of resin component and the type of compound which serves the role of the resin component.

For example, in the case of room temperature drying resins (lacquer-type), they are cured by evaporating off the volatile substances by drying. When these resins are thermosetting, they are optionally cured under heat according to the type of resin. The above-mentioned vinyl polymerizable resins such as an unsaturated polyester resin or acrylate resin can be cured by known means such as by electron beams or by using a known polymerization initiator such as azobisisobutyronitrile, di-t-butyl peroxide, benzoyl peroxide and the like.

The epoxy resins can be cured by known curing agents such as triethylenetetramine, polyamide polyamine, diaminodicyclohexylmethane, diaminodiphenylmethane, adipic acid dihydrazide, imidazole derivatives, dicyandiamide, boron trifluorideethylamine complex compound, a polymercapto compound, a polycarboxylic acid and its anhydride, and the like.

The phenolic resins can also be cured by the curing agents or by curing accelerators such as hexamethylenetetramine, para formaldehyde, p-toluene sulfonic acid, and the like.

The air drying type resins can be cured by known dryers such as lead naphthenate, cobalt acrylate, and the like.

The thermoplastic resins can be cured by heating and then cooling in accordance with known means.

The reduction in accordance with the present invention is preferably carried out during the stage of curing the resin component (d) or curing the above-described compounds which serve the role of the resin component. If the reducing reaction occurs too early or too late with respect to the curing stage, it affects the ability of the resulting cured product to retain conductivity. In particular, the reducing temperature is usually less than or equal to 250° C., preferably room temperature to 200° C., more preferably 50° C. to 180° C. in view of the curing conditions or the operability of the compound of the present invention on application. Consequently, the reducing agent containing the dihydroxy benzene ring, the metal copper powder, the copper compound, and the resin component can be chosen so that the reduction occurs during curing within the above-described temperature ranges. Additionally, it is preferable to include a basic compound, such as an amino group-containing compound in the composition of the present invention to effect the reduction reaction during the curing stage. Other known additives can also be used to assure that the reduction occurs during the curing stage and within the above-described temperature ranges.

The atmosphere in which the above reducing reaction is carried out has no special limitation. For example, suitable atmospheres include an inert gas such as nitrogen, or carbon dioxide, or air.

At the time of curing the resin component (d) or the compounds which serve the role of the resin component, various known additives may be incorporated prior to curing. Examples of these additives include molecular weight regulators such as mercapto propionic acid, carbon tetrabromide; stabilizers such as p-benzoquinone, and phenothiazine; reactive diluents such as butyl glycidyl ether, and phenyl glycidyl ether; plasticizers such as dibutyl phthalate, and tricresylphosphate; noble metals and their compounds which belong to group Ib or VIII of the periodic table such as gold, silver, and palladium; inorganic bases such as lithium hydroxide, and potassium hydroxide; amino compounds such as dimethylbenzylamine, ethanolamine, tris(N,N-dimethyl aminomethyl)phenol, and N,N-dimethyl aniline; acids such as acetic acid, oxalic acid, and benzoic acid, pH controllers such as sodium phosphate, borax, and potassium acetate, thickening agents such as polyvinyl alcohol, and polyvinyl pyrolidone; surface active agents such as potassium oleate, sodium dodecylbenzenesulfonate, polyoxyethylene laurylether, and octadecyl pyridinium chloride; solvents such as water, toluene, methyl ethyl ketone, ethylene glycol monomethylether, and ethylene glycol monoethylether; paraffin wax, carbon black, methyl ethyl ketoxime; lubricants, fire retardants, coloring agents, foaming agents, thixotropic agents, and the like.

The compositions of the present invention can be coated or printed on various substrates to obtain cured conductive products. Suitable substrates are organic substances such as polysulfone resin sheet, phenolic/paper laminate, epoxy/glass fabric laminate, polyimide film, nonwoven organic fabric, and the like, and inorganic substances such as glass, alumina, and the like. Also, coated iron plate, coated aluminum plate, and the like are suitable substrates. The cured products can also be obtained by curing the compositions of the present invention after casting it in a mould.

If required according to the end use or the environment of use or in order to ensure reliability, the cured products may be subjected to various protecting treatments. For example, the cured products may be electrically or chemically plated using nickel or copper. The cured products can also be coated using epoxy resins, phenolic resins, rosin type compounds, or polyethylene film. Or, the surfaces of the cured products can be treated with imidazole type or silicone type treating agents.

The conductive cured products obtained by curing the compositions of the present invention have superior conductivity which is retained substantially under high temperature and high humidity conditions. Because of these valuable properties, the conductive cured products are commercially useful in various forms such as paints, adhesives, printing ink, and moulded products. In the electrical and electronics fields the electrically conductive cured products of the present invention can take the form of an electrically conductive circuit, a cross-over circuit, a high-frequency protective circuit, a thermal release circuit, a packing of through-holes or as an adhesive for component parts. In the field of automobiles the conductive cured products can take the form of a dew inhibiting circuit in a window pane or as an antenna in a window. In the field of housing, the conductive cured products can take the form of a heater or a burglary preventing circuit in window panes.

In one embodiment of the present invention, a screen printing ink is prepared using the compositions of the present invention and it is applied to an electrical insulating substrate by screen printing. Then, the ink is cured to form an electrically conductive circuit. This conductive circuit is free from the defect of short-circuiting between circuits which is of great industrial value. Short-circuiting between circuits occurs in printed circuits produced with conventional silver type printing inks due to silver migration.

The invention is illustrated but not limited by the following examples. All parts, percentages, and proportions in these examples are by weight and all temperatures are in degrees C unless otherwise indicated. Furthermore, the concentration of a certain component is the weight percent thereof based on the total weight of all the components present unless otherwise indicated.

In the examples, the tests performed on the cured products of the present invention include an accelerated durability test (50° C. and relative humidity of 95% for 50 hours, 100 hours, and 1000 hours) wherein the formation of any green rust on the cured products was observed and wherein changes in resistance value were observed. Additionally, initial resistivity values of the cured products used in the examples were measured. An additional test on the conductive cured products for conductivity and heat stability involved immersion into a soldering bath.

Tests performed on the uncured liquid, or uncured substantially liquid, compositions of the present invention included observance for skin formation on the surface of the composition and observance for precipitation of metal copper powder.

The "printed material obtained by a screen printing process" used in the following examples was prepared in the following manner. S-shaped lines each having a total length of 200 mm and a width of 0.5 mm and arranged at intervals of 0.5 mm were provided by the following method on the surface of a material to be printed. A plate film was photographically formed by a direct method on a 180 mesh polyester screen so that the entire film thickness of the screen became 145 microns, and meshes other than the required lines were clogged. Using the resulting screen printing screen, each of the compositions used in the following examples was printed on each of the substances used in these examples by a manual process using a squeegee made of a polyurethane rubber with a rubber hardness of No. 70, and then the printed composition was cured under the curing conditions used in each of the experiments to form a printed material.

The resistance value and resistivity value described in the following examples as a measure for conductivity and the ability to retain conductivity was measured by using a tester (Type-3201, a product of Yokogawa Electric Works Limited, Japan) and a Wheatstone bridge (Type-2755, a product of Yokogawa Electric Works Limited, Japan). The tester was brought into contact with the two ends of the cured, printed product sample to measure resistance value. The resisitivity value is calculated after measuring the resistance value by means of the Wheatstone bridge and after measuring the thickness, length, and width of the cured product.

In the durability test of the cured product in the examples, a constant temperature and constant humidity device (desk type, JLH-400-40 type, a product of ETAC Company), was used under the accelerated conditions of 50° C., relative humidity 95%, for up to 1000 hours. At the expiration of the time period, the printed sample was removed from the device, left at room temperature for 1 hour, the resistance value was measured, and the appearance of the product was observed.

EXAMPLE I

Liquid compositions obtained in Run Nos. 1 to 6 below were printed to give about a 60μ thickness by the above "screen printing process" on the surface of each of six glass plates (thickness of 1.7 mm) whose one surface had been cleaned with ethyl acetate. The thus obtained printed samples were first dried at 100° C. for 20 minutes under an atmosphere of air in a constant temperature device. Then, the printed sample of Run No. 1 was thermally cured at 150° C. for 60 minutes.

The printed samples of Run Nos. 2–6 were thermally cured at 165° C. for 90 minutes. After the cured samples were left in the room to cool, the resistance value and resistivity value of each sample was measured and each sample was successively subjected to the durability test described above. The results are shown in Table 1.

Further, each composition of Run Nos. 2 through 6 was judged on skin formation by observing the change of 100 grams of liquid composition of each of the five runs which was stored in a closed 100 ml inner volume glass broadnecked bottle. The results are also shown in Table 1 below:

Run No. 1 (comparative example)

A liquid composition obtained by mixing (a) 110 parts of industrial copper powder (indefinite shape, average particle size 15μ, containing about 2.0% of copper oxide), (b) 23 parts of alcohol soluble resol type phenolic resin having a non-volatile content of 80% after curing (resol type phenolic resin made from 1 mol of phenol and 3 mol of formaldehyde), (c) 20 parts of 2-hydroxy-3-phenoxy propylphosphite, (d) 4 parts of dimethylaminoethanol, (e) 29 parts of mixed solvent consisting of diacetone alcohol and ethylene glycol (1:1) and (f) 2 parts of acetic acid.

Run No. 2 (Example of the present invention)

A liquid composition obtained by mixing (a) 110 parts of industrial copper powder (indefinite shape, average particle size 15μ, containing about 2.0% copper oxide), (b) 42 parts of hydroquinone modified resol type phenolic resin containing 80% of resin ingredient dissolved in ethylene glycol monobutylether (obtained by reacting 2 mol of hydroquinone, 0.5 mol of phenol and 6 mol of formaldehyde in the presence of an ammonia catalyst), (c) 0.2 part of tris(N,N-dimethylaminomethyl)phenol, and (d) 12 parts of ethyl acetoacetate.

Run No. 3 (Example of the present invention)

A liquid composition consisting of the same constituents (a) and (b) as the above Run No. 2, (c) 0.5 part of N,N'-dimethylaniline, (d) 8 parts of 4,4,4-trifluoro-1-phenyl-1,3-butanedione, and (e) 5 parts of diethyleneglycol-monomethylether.

Run No. 4 (Example of the present invention)

A liquid composition having the same contents as Run No. 3 except 5 parts of 2,2'-dipyridil were used instead of 8 parts of 4,4,4-trifluoro-1-phenyl-1,3-butanedione.

Run No. 5 (Example of the present invention)

A liquid composition obtained by mixing (a) 25 parts of industrial flake copper powder (average particle size 20μ, containing about 3.5% of copper oxide) and 100 parts of industrial electrolytic copper powder (average particle size 15μ, containing about 0.5% of copper oxide), (b) 10 parts of methylated methylol melamine resin, (c) 7 parts of catechol, (d) 18 parts of 2-methyl hydroquinone, (e) 15 parts of diethylene-glycol-monomethylether, (f) 2 parts of hexamethylene tetramine, and (g) 10 parts of industrial silver powder (arborescent, average particle size 1μ).

Run No. 6 (Example of the present invention)

A liquid composition made from 10 parts of acetylacetone and the composition of Run No. 5.

TABLE 1

| Run No. | Curing Conditions (Post Cure) | Initial Resistance Value ($\Omega$) | Initial Resistivity Value of Cured Products ($\Omega \cdot cm$) | Resistance Value After Accelerated Test ($\Omega$) (50° C./RH 95%) | | | Appearance At Accelerated Test of Cured Product | Skin Forming Phenomenon | Note |
|---|---|---|---|---|---|---|---|---|---|
| | | | | After 50 hrs. | After 100 hrs. | After 1000 hrs. | | | |
| 1 | 150° C./60 min. | 61.9 | $7.6 \times 10^{-4}$ | 95.4 | 281.5 | 4817.0 | Green rust occurred | — | Comparative example |
| 2 | 165° C./90 min. | 39.2 | $4.8 \times 10^{-4}$ | 42.5 | 42.8 | 44.1 | No change No green rust occurred | Skin formed after 2 days | Present invention |
| 3 | 165° C./90 min. | 31.3 | $3.7 \times 10^{-4}$ | 33.3 | 34.1 | 34.7 | No change No green rust occurred | No change after 3 months | Present invention |
| 4 | 165° C./90 min. | 32.1 | $3.7 \times 10^{-4}$ | 35.0 | 35.5 | 35.9 | No change No green rust occurred | No change after 3 months | Present invention |
| 5 | 165° C./90 min. | 11.3 | $1.2 \times 10^{-4}$ | 12.1 | 12.5 | 12.7 | No change No green rust occurred | Skin formed after several days | Present invention |
| 6 | 165° C./90 min. | 10.4 | $1.1 \times 10^{-4}$ | 10.7 | 10.9 | 11.0 | No change No green rust occurred | No change after 3 months | Present invention |

EXAMPLE II

Liquid compositions of Run Nos. 2 and 5 in Example I were screen printed and thermally cured as in Example I except 1.5 mm epoxy/glass fabric laminate were used instead of glass plates. The cured conductive sample plates were then immersed into a solder bath at 260° C. for 10 seconds. No abnormalities, such as blisters and the like, were observed. When the conductive cured sample plates were immersed into a solder bath at 300° C. for 10 seconds, the sample plate obtained using the Run No. 2 composition showed no abnormalities. However, the sample plate obtained from the Run No. 5 composition exhibited a few blisters.

EXAMPLE III

Liquid compositions obtained in Run Nos. 7 through 15 below were printed on glass plates by the same process as in Example I (Run Nos. 2 through 6) except for Run No. 15. In the latter run, the printed sample was thermally cured at 165° C. for 120 minutes instead of 90 minutes. Each of the cured products were subjected to the same durability test as in Example I. Further, each liquid composition of Run Nos. 7 through 15 was judged on skin formation by the same process of Example I. Also observed was the precipitation of any metal copper powder from the liquid compositions.

Run Nos. 7 through 15

The liquid compositions of Run Nos. 7 through 15 are the same as the Run No. 2 composition of Example I except the 12 parts of acetoethylacetate used in Run No. 2 was not used. Instead, the chelate forming compound in an amount to result in a liquid composition was used as shown in Table 2. Additionally, for Run Nos. 14 and 15, ethylene glycol monobutylether was not used in the liquid compositions.

The thermal curing conditions used in each of Run Nos. 7 through 15 as well as the test results for each run are presented in Table 3:

TABLE 2

| Run No. | Chelate Forming Compound | |
|---|---|---|
| | Kind | Amount (part) |
| 7 | Benzoyl acetone | 5.5 |
| 8 | 5,5-dimethyl-1,3-cyclohexane dione | 11.0 |
| 9 | Dimethyl glyoxime | 16.5 |
| 10 | 1,10-phenanthroline | 3.3 |
| 11 | Triethylenetetramine | 0.88 |
| 12 | Oxine | 6.0 |
| 13 | Acetylacetone | 11.0 |
| 14 | Acetylacetone | 25.0 |
| 15 | Acetylacetone | 35.0 |

3. A composition as claimed in claim 1 or 2 wherein said reducing agent and said resinous curable component are the same compound.

4. A composition as claimed in claim 1 or 2 wherein said copper compound, said reducing agent and said resinous curable component are the same compound.

5. A composition as claimed in claim 1 or 2 wherein said reducing agent is selected from the group consisting of hydroquinone, catechol, 2-methyl-hydroquinone, vinyl hydroquinone, tertiary butyl hydroquinone, chloro hydroquinone, phenyl hydroquinone, compounds having the chemical structure:

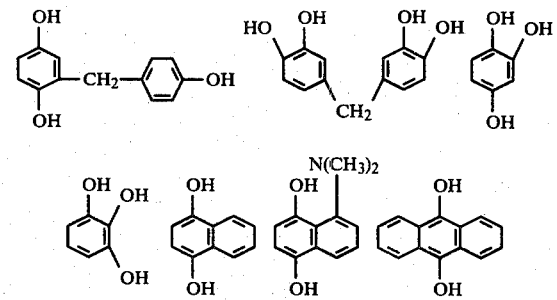

and mixtures thereof.

6. A composition as claimed in claim 3 wherein said reducing agent and said resinous curable component is a compound selected from the group consisting of a polymer or copolymer of vinyl hydroquinone, a hydroquinone-formaldehyde phenolic type resin, a hydroqui-

TABLE 3

| Run No. | Curing Condition (Post Cure) | Initial Resistance Value (Ω) | Initial Resistivity Value Of Cured Product (Ω · cm) | Resistance Value After Accelerated Test (Ω) (50° C./RH 95%) | | Appearance After Accelerated Test Of Cured Product | Skin Forming Phenomenon | Precipitation Of Metal Copper Powder Of Liquid Composition |
|---|---|---|---|---|---|---|---|---|
| | | | | After 100 hrs. | After 1000 hrs. | | | |
| 7 | 165° C./ 90 min. | 38.5 | $4.7 \times 10^{-4}$ | 41.3 | 42.5 | No change No green rust | No change after 3 months | No change after 3 months |
| 8 | 165° C./ 90 min. | 40.0 | $4.8 \times 10^{-4}$ | 43.3 | 45.1 | No change No green rust | No change after 3 months | No change after 3 months |
| 9 | 165° C./ 90 min. | 45.6 | $5.0 \times 10^{-4}$ | 50.8 | 53.3 | No change No green rust | No change after 3 months | No change after 3 months |
| 10 | 165° C./ 90 min. | 38.8 | $4.6 \times 10^{-4}$ | 41.5 | 42.1 | No change No green rust | No change after 3 months | No change after 3 months |
| 11 | 165° C./ 90 min. | 37.2 | $4.7 \times 10^{-4}$ | 40.2 | 41.8 | No change No green rust | Slight skin forming after 40 days | No change after 3 months |
| 12 | 165° C./ 90 min. | 35.6 | $4.6 \times 10^{-4}$ | 39.0 | 40.4 | No change No green rust | No change after 3 months | No change after 3 months |
| 13 | 165° C./ 90 min. | 37.8 | $4.5 \times 10^{-4}$ | 40.8 | 42.0 | No change No green rust | No change after 3 months | No change after 3 months |
| 14 | 165° C./ 90 min. | 40.5 | $4.8 \times 10^{-4}$ | 43.9 | 46.7 | No change No green rust | No change after 3 months | No change after 3 months |
| 15 | 165° C./ 120 min. | 65.1 | $5.3 \times 10^{-4}$ | 70.4 | 73.1 | No change No green rust | No change after 3 months | Slight precipitation after 3 months* |

*Recovered easily to the state before precipitation by simple mixing.

What is claimed is:

1. A composition for the production of conductive cured products comprising (a) a metal copper powder, (b) a copper compound, (c) a reducing agent which contains a substituted or unsubstituted ortho or para dihydroxy benzene ring, and (d) a resinous curable component, the amount of said reducing agent being sufficient to reduce a substantial portion of the copper in said copper compound to metallic copper.

2. A composition as claimed in claim 1 which further includes a chelate forming compound.

none-phenol-formaldehyde phenolic type resin, a catechol-formaldehyde phenolic type resin, a 1,4-dihydroxy naphthalene-formaldehyde resin and mixtures thereof.

7. A composition as claimed in claim 1 or 2 wherein the amount of said reducing agent is sufficient to reduce at least 80% by weight of the copper in said copper compound to metallic copper.

8. A composition as claimed in claim 7 wherein the amount of said copper compound is 0.1 to 30% by weight of said metal copper powder.

9. A composition as claimed in claim 8 wherein the amount of said resinous curable component is about 5 to 60% by weight based upon the total weight of the non-volatile ingredients of the composition.

10. A composition as claimed in claim 2 wherein said chelate forming compound has a logarithm value of the stability constant (Kma) of cupric ion complex of at least 3 at an ionic strength of 0.1 at 25° C.

11. A composition as claimed in claim 2 wherein said chelate forming compound is selected from the group consisting of β-diketones, phenolic compounds, 2,2'-dipyridil, 1,10-phenanthroline and dimethylglyoxime.

12. A composition as claimed in claim 2 wherein the amount of said reducing agent is sufficient to reduce at least 80% by weight of the copper in said copper compound to metallic copper, the amount of said copper compound is 0.1 to 30% by weight of said metal copper powder, the amount of said resinous curable component is about 5 to 60% by weight based upon the total weight of the non-volatile ingredients of the composition, and the amount of said chelate forming compound is 0.5 to 100% by weight based on the total weight of said metal copper powder and said copper compound.

13. A composition as claimed in claim 2 or 12 wherein said chelate forming compound is selected from the group consisting of acetylacetone, 4,4,4-trifluoro-1-phenyl-1,3-butanedione, benzoyl acetone, dibenzoyl methane, 5,5-dimethyl-1,3-cyclohexanedione, oxine, oxine-5-sulfonic acid, dimethyl glyoxime, 1-nitroso-2-naphthol, salicylaldehyde, 2,2'-dipyridil, and 1,10-phenanthroline.

14. A composition as claimed in claim 1 or 2 which further contains an amine base.

15. A composition as claimed in claim 14 wherein said reducing agent reduces said copper in copper compound and, said resinous curable component is cured, at a temperature of less than or equal to 250° C.

16. A process for producing a conductive cured product which comprises reacting a copper compound which is in the cuprous and/or cupric state with a reducing agent which contains a substituted or unsubstituted ortho or para dihydroxy benzene ring, in the presence of both a metallic copper powder and a resinous curable component, the amount of said reducing agent being sufficient to reduce a substantial amount of the copper in said copper compound to metallic copper, to reduce said copper compound to metallic copper and to cure said resinous curable component during the reduction of said copper compound to integrate precipitated metallic copper and said resinous curable component into said conductive cured product.

17. A process according to claim 16 wherein the reaction is conducted in the further presence of a chelate forming compound.

18. A process according to claim 16 or 17 wherein the resinous curable component is cured and the copper compound is reduced at a temperature of less than or equal to 250° C.

19. A process as claimed in claim 16 wherein the amount of said reducing agent is sufficient to reduce at least 80% by weight of the copper in said copper compound to metallic copper.

20. A process as claimed in claim 19 wherein said reducing agent and said resinous curable component are the same compound.

21. A process as claimed in claim 19 wherein said copper compound, said reducing agent, and said resinous curable component are the same compound.

22. A process as claimed in claim 16 further comprising plating or coating the conductive cured product with a protective coating.

23. A process as claimed in claim 22 wherein the protective coating is selected from the group consisting of nickel, copper, epoxy resins, phenolic resins, rosin-type compounds, polyethylene, imidazole treating agents, and silicone treating agents.

* * * * *